(12) United States Patent
Hatanaka et al.

(10) Patent No.: US 8,044,476 B2
(45) Date of Patent: Oct. 25, 2011

(54) WIDE RANGE RADIATION DETECTOR AND MANUFACTURING METHOD

(75) Inventors: Yoshinori Hatanaka, Hamamatsu (JP); Toru Aoki, Hamamatsu (JP)

(73) Assignee: National University Corporation Shizuoka University (JP)

( * ) Notice: Subject to any disclaimer, the term of this patent is extended or adjusted under 35 U.S.C. 154(b) by 0 days.

(21) Appl. No.: 11/454,522

(22) Filed: Jun. 16, 2006

(65) Prior Publication Data

US 2007/0176200 A1 Aug. 2, 2007

Related U.S. Application Data

(63) Continuation-in-part of application No. PCT/JP2004/019156, filed on Dec. 15, 2004.

(30) Foreign Application Priority Data

Dec. 16, 2003 (JP) .................................. 2003-418086
Dec. 26, 2003 (JP) .................................. 2003-433694

(51) Int. Cl.
*H01L 31/00* (2006.01)
(52) U.S. Cl. ........ 257/440; 257/184; 257/200; 257/428; 257/431; 257/436; 257/461; 257/614; 257/E27.122; 257/E27.14; 257/E27.146; 257/E31.005; 257/E31.015; 257/E31.018; 257/E31.086; 257/E31.092
(58) Field of Classification Search ........... 257/E31.086, 257/E31.092, E31.015, E31.005, E31.006, 257/E31.018, 200, 614, E27.133, E31.058, 257/E27.14, E27.146, 184, 428, 431, 436, 257/440, 461, E27.122
See application file for complete search history.

(56) References Cited

U.S. PATENT DOCUMENTS

| | | | | |
|---|---|---|---|---|
| 3,930,161 A | * | 12/1975 | Ameurlaine et al. | 250/370.08 |
| 4,219,368 A | | 8/1980 | David | |
| 4,536,607 A | * | 8/1985 | Wiesmann | 136/249 |
| 4,677,289 A | * | 6/1987 | Nozaki et al. | 250/226 |
| 4,771,321 A | * | 9/1988 | Lewis | 136/249 |
| 6,011,264 A | * | 1/2000 | Lachish et al. | 250/370.13 |
| 6,034,373 A | * | 3/2000 | Shahar et al. | 250/370.01 |
| 7,102,676 B1 | * | 9/2006 | Mochizuki | 348/307 |

(Continued)

FOREIGN PATENT DOCUMENTS

JP 51-15714 5/1976

(Continued)

OTHER PUBLICATIONS

Y. Hatanaka et al., "X-Ray imaging sensor using CdTe/a-Si: Heterojunction", Advances in Electronics and Electron Physics., vol. 74, 1998, pp. 257 to 267.

(Continued)

*Primary Examiner* — Jay C Kim
(74) *Attorney, Agent, or Firm* — Ostrolenk Faber LLP

(57) ABSTRACT

A radiation detector comprising a II-VI compound semiconductor substrate that absorbs radiation having a first energy, a II-VI compound semiconductor layer of a first conductivity type provided on a main surface of the II-VI compound semiconductor substrate, a metal layer containing at least one of a group III element and a group V element provided on the II-VI compound semiconductor layer, a IV semiconductor layer having a second conductivity type opposite to the first conductivity type provided on the metal layer, and a IV semiconductor substrate that absorbs radiation having a second energy different from the first energy provided on the IV semiconductor layer.

15 Claims, 13 Drawing Sheets

U.S. PATENT DOCUMENTS

| | | | |
|---|---|---|---|
| 2003/0218134 A1* | 11/2003 | Matoba et al. | 250/370.13 |
| 2004/0003837 A1* | 1/2004 | Mauk | 136/244 |

FOREIGN PATENT DOCUMENTS

| | | |
|---|---|---|
| JP | 51-15714 A | 5/1976 |
| JP | 58-93292 | 6/1983 |
| JP | 61-216455 | 9/1986 |
| JP | 61-216455 A | 9/1986 |
| JP | 63-145985 | 6/1988 |
| JP | 63-145985 A | 6/1988 |
| JP | 3-77373 | 4/1991 |
| JP | 5-3337 | 1/1993 |
| JP | 5-3337 A | 1/1993 |
| JP | 9-237907 | 9/1997 |
| JP | 9-237907 A | 9/1997 |
| JP | 10-512398 | 11/1998 |
| JP | 11-330505 | 11/1999 |
| JP | 11-330505 A | 11/1999 |
| JP | 2003-344548 | 12/2003 |
| JP | 2003-344548 A | 12/2003 |
| JP | 2005-183454 | 7/2005 |

OTHER PUBLICATIONS

International Search Report PCT/JP2004/019156 dated Feb. 25, 2005.

International Search Report issued Mar. 15, 2005.

Hatanaka, Y. et al. "X-ray Imaging Sensor Using CdTe/a-Si:H Heterojunction," *Advances in Electronics and Electron Physics*, vol. 74, pp. 257-267, (1988).

Office Action issued Jun. 3, 2008 in the corresponding Japanese patent application.

Notice of Allowance issued on Sep. 9, 2008 in corresponding Japanese application with English language translation.

* cited by examiner

WIDE RANGE RADIATION DETECTOR AND MANUFACTURING METHOD

CROSS-REFERENCE TO RELATED APPLICATIONS

This is a Continuation-In-Part application of application No. PCT/JP2004/019156 filed on Dec. 15, 2004 now pending.

BACKGROUND OF THE INVENTION

1. Field of the Invention

The present invention relates to a radiation detector and a method for manufacturing the same.

2. Related Background Art

Hitherto, detecting elements have been constructed using semiconductor elements having as a principal material thereof Si (silicon) for soft X-rays, and CdTe (cadmium telluride) for hard X-rays (see Published Japanese Translation of PCT Application No. H10-512398). However, it has been difficult to obtain good sensitivity for both soft X-rays and hard X-rays.

Moreover, in Japanese Patent Application Laid-open No. 2003-344548 and Hatanaka et al., Advances in Electronics and Electron Physics, Vol. 74, pp 257-267 (1988), it is disclosed that by placing different semiconductor crystals on one another, sensitivity to radiation such as X-rays having different energies is obtained, and that wires are connected to each of the semiconductor crystals. In Japanese Patent Application Laid-open No. H5-3337, a radiation detector that distinguishes between two types of radiation, and detects these types of radiation with high sensitivity is disclosed.

SUMMARY OF THE INVENTION

However, in the case, for example, of forming a detecting element by placing a CdTe substrate and an Si substrate on one another, a pair of wires is required for each of the CdTe substrate and the Si substrate. Two pairs of wires are thus required for one detecting element.

In the case of arranging such detecting elements two-dimensionally so as to construct an image sensing element for obtaining a two-dimensional image, because two pairs of wires are required for each detecting element, the wiring becomes complicated.

Furthermore, in the case of forming a detecting element in which many types of semiconductor substrates are placed on one another in many tiers so as to obtain sensitivity to radiation having many different energies, many wires are required for one detecting element. In the case of constructing an image sensing element using such detecting elements, carrying out the wiring is difficult.

In view of the above state of affairs, it is an object of the present invention to provide a radiation detector and a method for manufacturing the same according to which wiring can be simplified.

To attain the above object, a radiation detector of the present invention comprises a II-VI compound semiconductor substrate that absorbs radiation having a first energy, a II-VI compound semiconductor layer of a first conductivity type provided on a main surface of the II-VI compound semiconductor substrate, a metal layer containing at least one of a group III element and a group V element provided on the II-VI compound semiconductor layer, a IV semiconductor layer of a second conductivity type opposite to the first conductivity type provided on the metal layer, and a IV semiconductor substrate that absorbs radiation having a second energy different from the first energy provided on the IV semiconductor layer.

A method for manufacturing a radiation detector of the present invention comprises the steps of: forming a metal layer containing at least one of a group III element and a group V element on a main surface of at least one of a II-VI compound semiconductor substrate that absorbs radiation having a first energy and a IV semiconductor substrate that absorbs radiation having a second energy different to the first energy; and disposing the II-VI compound semiconductor substrate and the IV semiconductor substrate facing one another such that the metal layer is sandwiched therebetween, and compression-bonding the II-VI compound semiconductor substrate and the IV semiconductor substrate together by heating.

DESCRIPTION OF THE PREFERRED EMBODIMENTS

Figure 1:
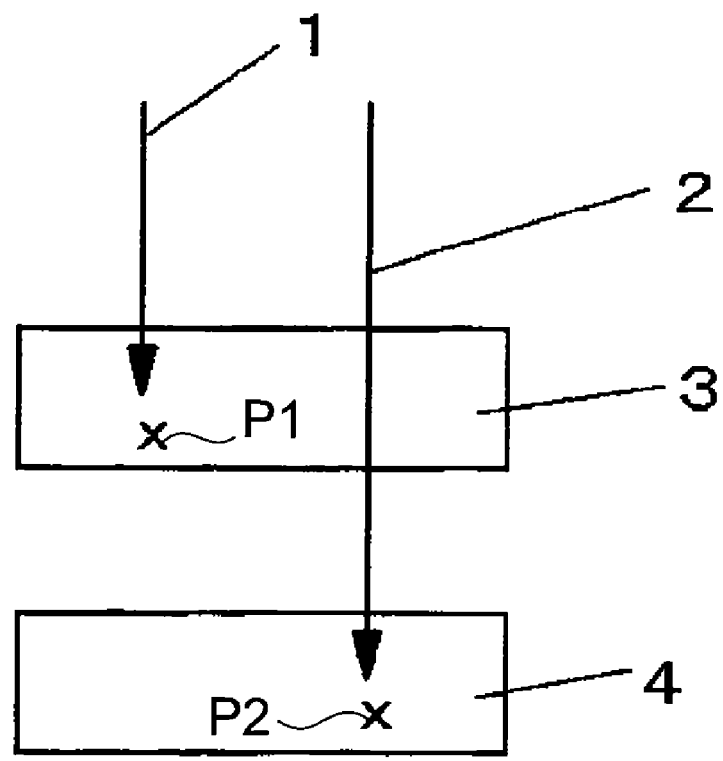
FIG. 1 is a drawing showing X-ray absorption positions.

Following is a detailed description of embodiments of the present invention with reference to the attached drawings. Note that in the description of the drawings, identical or equivalent elements are designated by the same reference numeral, and repeated description is omitted.

FIG. 1 is a drawing showing X-ray absorption positions. As shown in FIG. 1, an Si substrate 3 and a CdTe substrate 4 are disposed on one another. Upon X-rays being made to be incident from the Si substrate 3 side, soft X-rays 1 are absorbed at a position P1 in the Si substrate 3. On the other hand, hard X-rays 2 pass through the Si substrate 3 and are absorbed at a position P2 in the CdTe substrate 4. By providing electrodes on the Si substrate 3 and the CdTe substrate 4, charge produced accompanying the X-ray absorption can be detected.

First Embodiment

Figure 2:
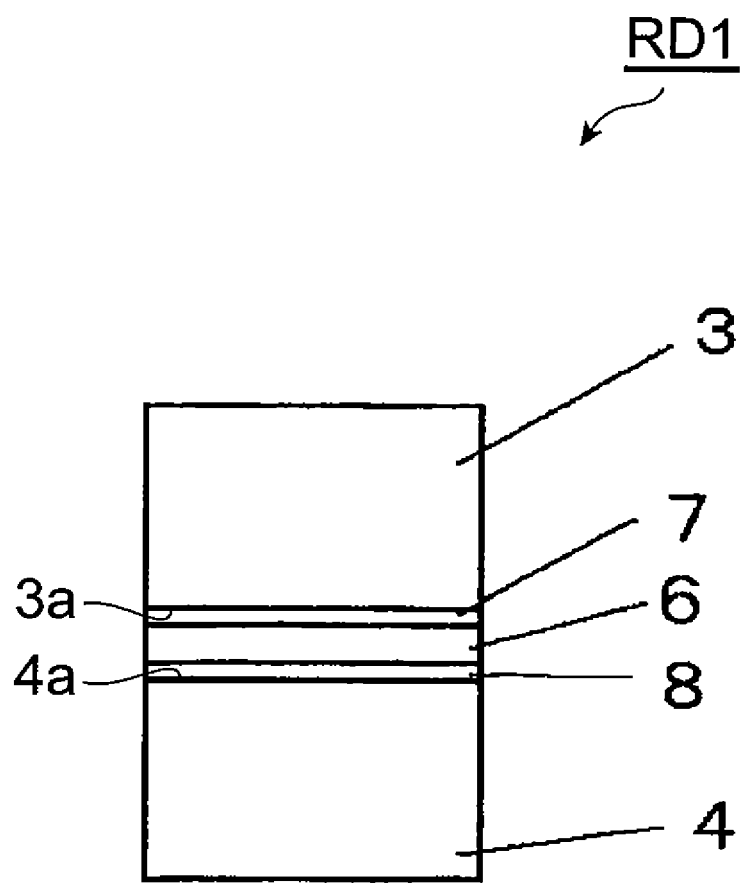
FIG. 2 is a drawing schematically showing a radiation detector according to a first embodiment.

FIG. 2 is a drawing schematically showing a radiation detector according to a first embodiment. The radiation detector RD1 shown in FIG. 2 is a semiconductor element that detects high-energy electromagnetic radiation such as X-rays. The radiation detector RD1 comprises a CdTe substrate 4 (II-VI compound semiconductor substrate), an n-type CdTe layer 8 (II-VI compound semiconductor layer of first conductivity type) provided on a main surface 4a of the CdTe substrate 4, an In layer 6 (metal layer) provided on the n-type CdTe layer 8, a p-type Si layer 7 (IV semiconductor layer of second conductivity type) provided on the In layer 6, and an Si substrate 3 (IV semiconductor substrate) provided on the p-type Si layer 7. The p-type Si layer 7 contains an element such as In as a p-type dopant. The n-type CdTe layer 8 contains an element such as In as an n-type dopant. A CdZnTe substrate may be used instead of the CdTe substrate 4.

The absorption coefficient to radiation of the CdTe substrate 4 and the absorption coefficient to radiation of the Si substrate 3 are different from one another. CdTe (cadmium telluride) or CdZnTe (cadmium zinc telluride) is used to detect hard X-rays (radiation having a first energy). The CdTe substrate 4 absorbs hard X-rays. Si (silicon) is used to detect soft X-rays (radiation having a second energy). The Si substrate 3 absorbs soft X-rays. The radiation detector RD1 is thus a broad energy range radiation detector. Radiation is incident from the Si substrate 3 side. In the radiation detector RD1, the Si substrate 3 and the CdTe substrate 4 are formed on one another, and hence the electrostatic capacitance is low. The radiation detector RD1 thus has high radiation detection sensitivity.

Figure 3A:
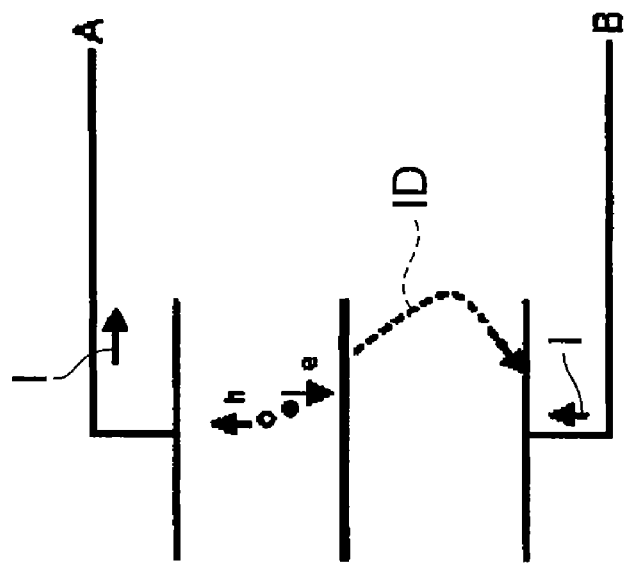
FIGS. 3A to 3C are schematic drawings for explaining the operation of the radiation detector according to the first embodiment.
Figure 3B:
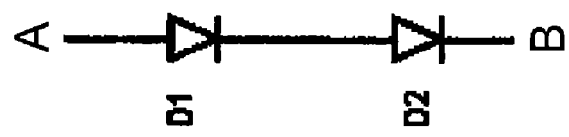
Figure 3C:
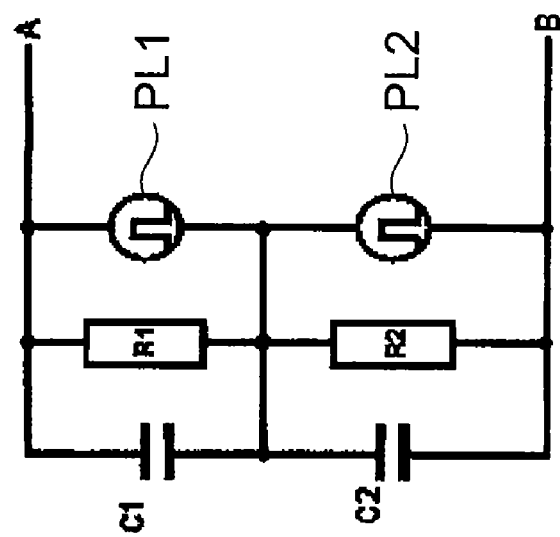

FIGS. 3A to 3C are schematic drawings for explaining the operation of the radiation detector according to the first embodiment. In FIG. 3A, "A" represents a terminal on the CdTe substrate 4 side, and "B" represents a terminal on the Si substrate 3 side. Upon, for example, hard X-rays being incident on the radiation detector RD1, as shown in FIG. 3A, charge is (electrons e and holes h are) produced in the CdTe substrate 4. The In layer 6 is floating, and hence a displacement current due to movement of charge in the CdTe substrate 4 flows as a pulse current I to the terminal on the Si substrate 3 side via the In layer 6 through capacitive coupling ID due to electrostatic induction.

In this way, the radiation detector RD1 produces a sharp pulse signal of not more than a microsecond upon radiation being incident. The radiation is detected by reading the pulse height and frequency of such pulse signals.

As shown in FIG. 3B, the CdTe substrate 4 corresponds to a first diode D1, and the Si substrate 3 corresponds to a second diode D2. An equivalent circuit for the diodes D1 and D2 is shown in FIG. 3C. As shown in FIG. 3C, the diode D1 corresponds to a capacitor C1 and a resistor R1. A pulse current PL1 flows through the capacitor C1 and the resistor R1. The diode D2 corresponds to a capacitor C2 and a resistor R2. A pulse current PL2 flows through the capacitor C2 and the resistor R2.

Assuming, for example, that the thickness of the Si substrate 3 and the thickness of the CdTe substrate 4 are the same, and moreover the permittivity of the Si substrate 3 and the permittivity of the CdTe substrate 4 are the same, the pulse current due to the Si substrate 3 (or the CdTe substrate 4) absorbing radiation is half the pulse current due to both the Si substrate 3 and the CdTe substrate 4 absorbing radiation. The pulse current is determined by the constituent material, thickness and so on of the Si substrate 3 and the CdTe substrate 4. Calibration of the measured pulse current can thus be carried out using a standard pulse current obtained upon making radiation of a standard intensity be incident on the radiation detector RD1 in advance.

In the case that the In layer 6 is floating, if charge is produced in only one of the diodes D1 and D2, then bias voltages applied to the diodes D1 and D2 become biased. In the case that only soft X-rays are made to be incident on the radiation detector RD1, charge is produced in only the Si substrate 3. In this case, it is expected that the bias voltage applied to the Si substrate 3 decreases, and the bias voltage applied to the CdTe substrate 4 increases by the amount of this decrease. However, in reality, the mobility of carriers in the Si substrate 3 is higher than the mobility of carriers in the CdTe substrate 4, and hence the bias voltage applied to the Si substrate 3 hardly decreases. The sensitivity of the radiation detector RD1 thus hardly changes. A reverse leakage current in the CdTe substrate 4 increases as the bias voltage increases, and as a result balances the current produced in the Si substrate 3. In the case that the incident radiation has high energy, charge is produced in both the Si substrate 3 and the CdTe substrate 4, and hence current flows through the whole of the radiation detector RD1.

In the radiation detector RD1, because the Si substrate 3 and the CdTe substrate 4 are bonded together by the In layer 6, the mechanical strength can be increased. Moreover, because the In layer 6 is floating, there is no need to connect a wire to the In layer 6. The wiring can thus be simplified. Furthermore, because the wiring can be simplified, such radiation detectors RD1 can be arranged two-dimensionally. As a result, an image sensing element for obtaining a two-dimensional image can be manufactured. Furthermore, the In of the In layer 6 does not have an adverse effect on the impurity (dopant) in the p-type Si layer 7 and the n-type CdTe layer 8, but rather functions as the dopant. A structure in which a CdTe-pin (p-type—intrinsic—n-type) semiconductor element and an Si-pin semiconductor element are connected in series can thus be manufactured easily. Note that an element in which such radiation detectors RD1 are arranged one-dimensionally can also be manufactured.

In the above description, the Si substrate 3 has been given as an example of the IV semiconductor substrate, but a IV semiconductor substrate other than an Si substrate can be used instead. The CdTe substrate 4 has been given as an example of the II-VI compound semiconductor substrate, but a II-VI compound semiconductor substrate other than a CdTe substrate can be used instead. The In layer 6 has been given as an example of the metal layer, but another group III metal layer (gallium layer, aluminum layer, etc.) or a group V metal layer (antimony layer, bismuth layer, arsenic layer, etc.) can be used instead. Moreover, from the viewpoint of improving the bonding ability of the metal layer, instead of the In layer 6, it is preferable to use a metal layer made of lead (Pb), tin (Sn) or the like having a group III element (indium, gallium, or aluminum) or a group V element (bismuth, antimony, or arsenic) added thereto. Of these, from the viewpoint of improving the bonding ability, lead or tin having a few percent of antimony (Sb) added thereto is particularly preferable.

Figure 4A:
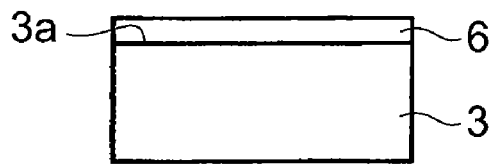
FIGS. 4A to 4C are process drawings schematically showing a method for manufacturing the radiation detector according to the first embodiment.
Figure 4B:
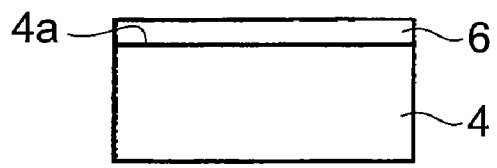
Figure 4C:
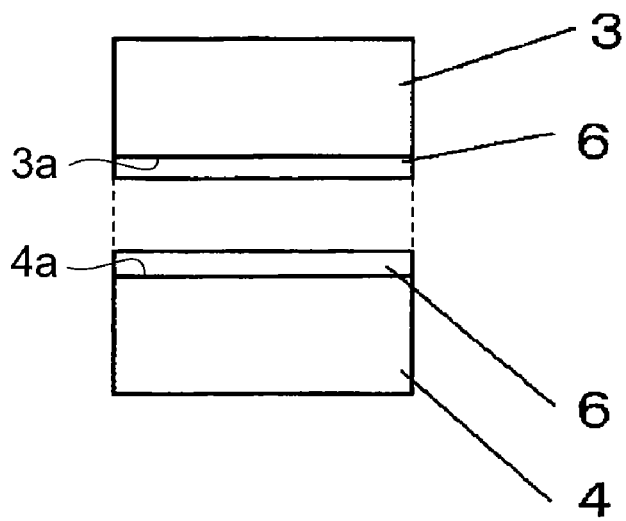

FIGS. 4A to 4C are process drawings schematically showing a method for manufacturing the radiation detector according to the first embodiment. Following is a description of a method for manufacturing the radiation detector RD1.

(Metal Layer Formation Step)

As shown in FIG. 4A, an In layer 6 is deposited by vapor deposition on a main surface 3a of the Si substrate 3. On the other hand, as shown in FIG. 4B, an In layer 6 is deposited by vapor deposition on the main surface 4a of the CdTe substrate 4. An In layer 6 may alternatively be deposited by vapor deposition on only one of the main surface 3a of the Si substrate 3 and the main surface 4a of the CdTe substrate 4.

The n-type CdTe layer 8 containing In may be formed by carrying out doping using an excimer laser or diffusive doping by heating on the CdTe substrate 4 onto which the In layer 6 has been deposited by vapor deposition. The p-type Si layer 7 containing In may be formed by carrying out doping using an excimer laser or diffusive doping by heating on the Si substrate 3 onto which the In layer 6 has been deposited by vapor deposition. The p-type Si layer 7 may alternatively be formed by doping the main surface 3a of the Si substrate 3 with a dopant other than In such as boron (B) in advance.

Annealing using an excimer laser is preferably carried out such that the group VI element which has a high vapor pressure does not escape from the surface of the CdTe substrate 4. Accordingly, for example, a 50 mJ to 150 mJ excimer laser is irradiated for 20 ns in an inert gas such as nitrogen or argon at 3 to 5 atmospheres.

(Heating Compression Bonding Step)

As shown in FIG. 4C, the Si substrate 3 and the CdTe substrate 4 are disposed facing one another with the In layer 6 therebetween, and heating compression bonding is carried out to stick the Si substrate 3 and the CdTe substrate 4 together. The In layer 6 functions as a bonding layer, whereby the Si substrate 3 and the CdTe substrate 4 are bonded together. Through the heating compression bonding, In in the In layer 6 diffuses into the Si substrate 3 and the CdTe substrate 4. As a result, the n-type CdTe layer 8 and the p-type Si layer 7 are formed. In this way, the radiation detector RD1 shown in FIG. 2 can be manufactured.

Second Embodiment

Figure 5:
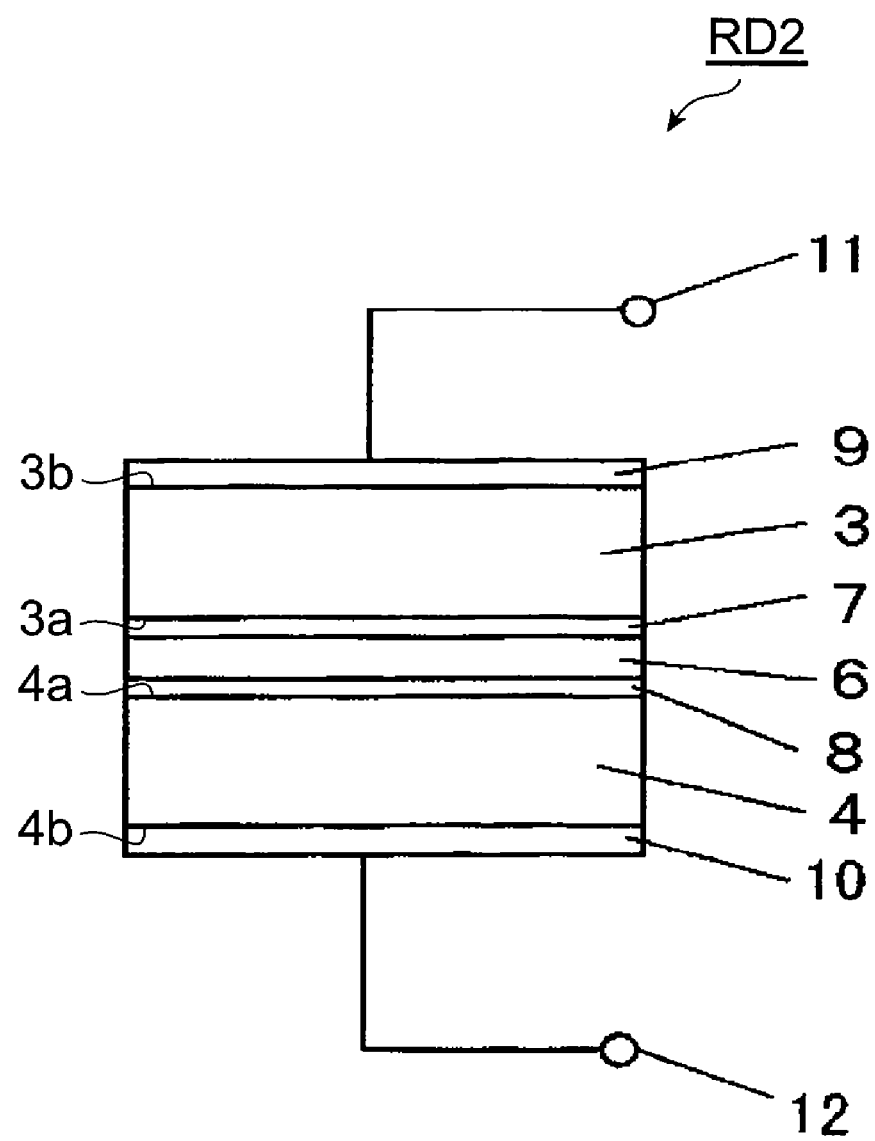
FIG. 5 is a drawing schematically showing a radiation detector according to a second embodiment.

FIG. 5 is a drawing schematically showing a radiation detector according to a second embodiment. In addition to the constitution of the radiation detector RD1, the radiation detector RD2 shown in FIG. 5 further comprises an n-type Si layer 9 provided on the Si substrate 3, a signal terminal 11 that is electrically connected to the n-type Si layer 9 by a wire, a p-type CdTe layer 10 provided on a rear surface 4b (the surface on the opposite side to the main surface 4a) of the CdTe substrate 4, and a signal terminal 12 that is electrically connected to the p-type CdTe layer 10 by a wire. The Si substrate 3, the p-type Si layer 7, and the n-type Si layer 9 constitute a pin diode. The CdTe substrate 4, the n-type CdTe layer 8, and the p-type CdTe layer 10 constitute a pin diode. In the radiation detector RD2, the two pin diodes are connected together in series. For the radiation detector RD2, working effects similar to for the radiation detector RD1 are obtained.

The p-type CdTe layer 10 contains a group V element such as antimony (Sb) as a dopant. Instead of the p-type CdTe layer 10, a metal layer of gold (Au), platinum (Pt), or the like may be used. In this case, a Schottky junction is formed. The n-type Si layer 9 contains a group V element such as phosphorus (P) as a dopant.

A positive electric potential is applied to the n-type Si layer 9 via the signal terminal 11, and a negative electric potential is applied to the p-type CdTe layer 10 via the signal terminal 12, whereby a reverse bias voltage is applied to both pin diodes. Upon X-rays or γ-rays being irradiated onto the n-type Si layer 9, soft X-rays are absorbed mainly in the Si substrate 3. The soft X-rays are thus annihilated in the Si substrate 3, and electrons e and holes h are produced. As a result, a signal is outputted via the signal terminals 11 and 12 to the outside. On the other hand, hard X-rays are absorbed in the CdTe substrate 4. The hard X-rays are thus annihilated in the CdTe substrate 4, and electrons e and holes h are produced. As a result, a signal is outputted via the signal terminals 11 and 12 to the outside.

The radiation detector RD2 is manufactured, for example, as follows. In the metal layer formation step described earlier, a rear surface 3b (the surface on the opposite side to the main surface 3a) of the Si substrate 3 is doped with a dopant in advance, so as to form the n-type Si layer 9. On the other hand, the rear surface 4b of the CdTe substrate 4 is doped with a dopant in advance, so as to form the p-type CdTe layer 10. After that, the heating compression bonding step described earlier is carried out, thus bonding the Si substrate 3 and the CdTe substrate 4 together. Next, a wire is connected to the n-type Si layer 9 to form the signal terminal 11, and a wire is connected to the p-type CdTe layer 10 to form the signal terminal 12.

The radiation detector RD2 may comprise a p-type Si layer and an n-type CdTe layer instead of the n-type Si layer 9 and the p-type CdTe layer 10 respectively. In this case, the Si substrate 3, the p-type Si layer 7, and the p-type Si layer constitute a pip diode. The CdTe substrate 4, the n-type CdTe layer 8, and the n-type CdTe layer constitute a nin diode.

Third Embodiment

Figure 6:
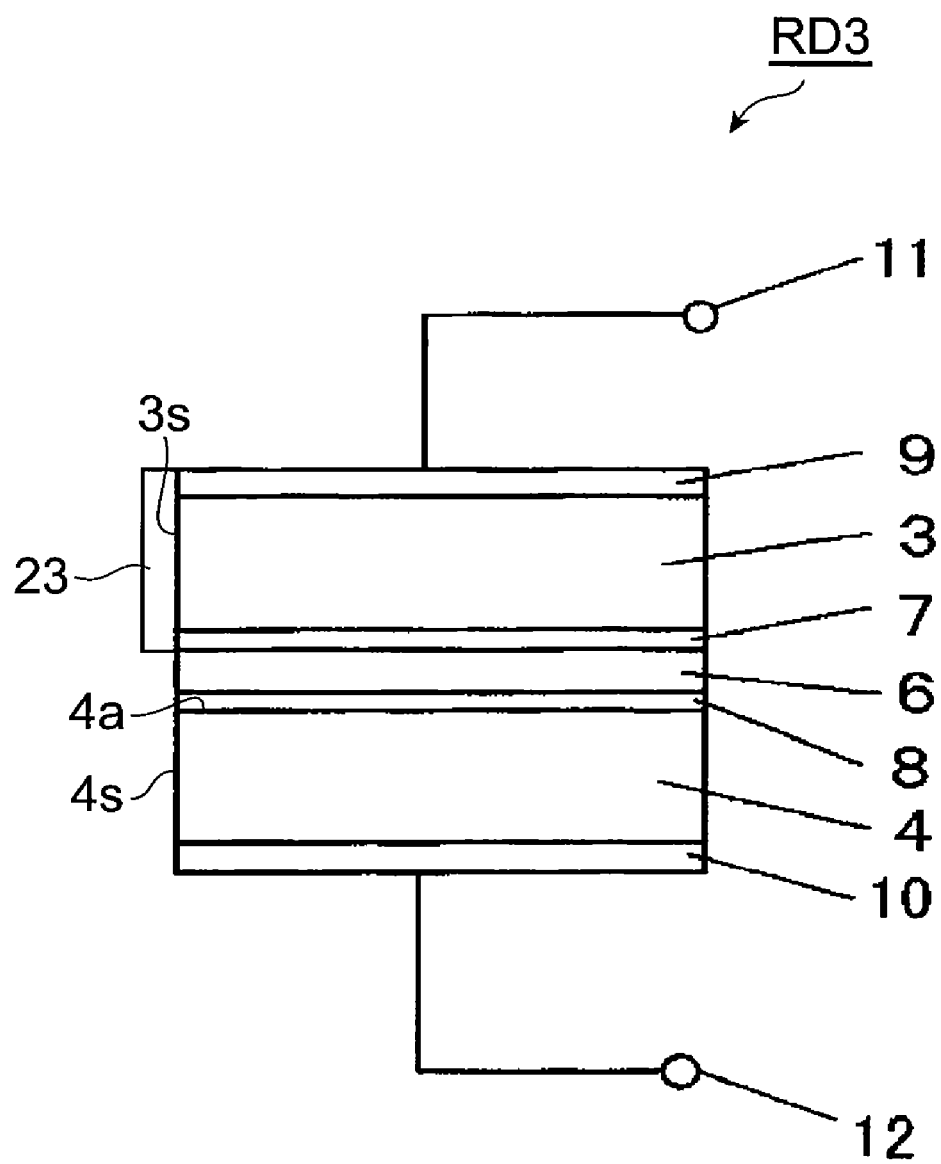
FIG. 6 is a drawing schematically showing a radiation detector according to a third embodiment.

FIG. 6 is a drawing schematically showing a radiation detector according to a third embodiment. In addition to the constitution of the radiation detector RD2, the radiation detector RD3 shown in FIG. 6 further comprises a conductor layer 23 provided on a side surface 3s of the Si substrate 3. The conductor layer 23 electrically connects the n-type Si layer 9 and the p-type Si layer 7 together. The conductor layer 23 is made, for example, of a metal such as Pt. The conductor layer 23 is formed on the side surface 3s of the Si substrate 3 using vapor deposition. For the radiation detector RD3, working effects similar to for the radiation detector RD2 are obtained.

In the case that a reverse bias voltage is applied to the Si substrate 3, the diode containing the Si substrate 3 exhibits high insulation. When a current is produced in the Si substrate 3 due to radiation absorption in the radiation detector RD3, this current flows through the conductor layer 23. The conductor layer 23 acts as a bypass.

The conductor layer 23 is connected in parallel to the Si substrate 3. The bias voltage applied to the Si substrate 3 can thus be adjusted by adjusting the resistance of the conductor layer 23. The resistance of the conductor layer 23 is preferably adjusted such that the combined resistance between the resistance of the conductor layer 23 and the resistance of the Si substrate 3 when the reverse bias voltage is being applied is approximately equal to the resistance of the CdTe substrate 4 when the reverse bias voltage is being applied.

The intrinsic resistivity of the i layer of the diode containing the Si substrate 3 is generally in a range of $10^8$ Ω·cm to $10^9$ Ω·cm. The resistance of the conductor layer 23 is preferably approximately equal to the value obtained by dividing the intrinsic resistivity of the i layer by the element area of the diode.

Such a conductor layer 23 may alternatively be provided on a side surface 4s of the CdTe substrate 4, or may alternatively be provided on both the side surface 3s of the Si substrate 3 and the side surface 4s of the CdTe substrate 4. In the case that a conductor layer 23 is provided on the side surface 4s of the CdTe substrate 4, the conductor layer 23 electrically connects the n-type CdTe layer 8 and the p-type CdTe layer 10 together. The bias voltage applied to the CdTe substrate 4 can be adjusted through the conductor layer 23. Whether to provide a conductor layer 23 on the side surface 3s of the Si substrate 3, or on the side surface 4s of the CdTe substrate 4 is determined in accordance with the leakage current when a reverse bias voltage is applied to the i layer of the diode containing the Si substrate 3 and the i layer of the diode containing the CdTe substrate 4.

Fourth Embodiment

Figure 7:
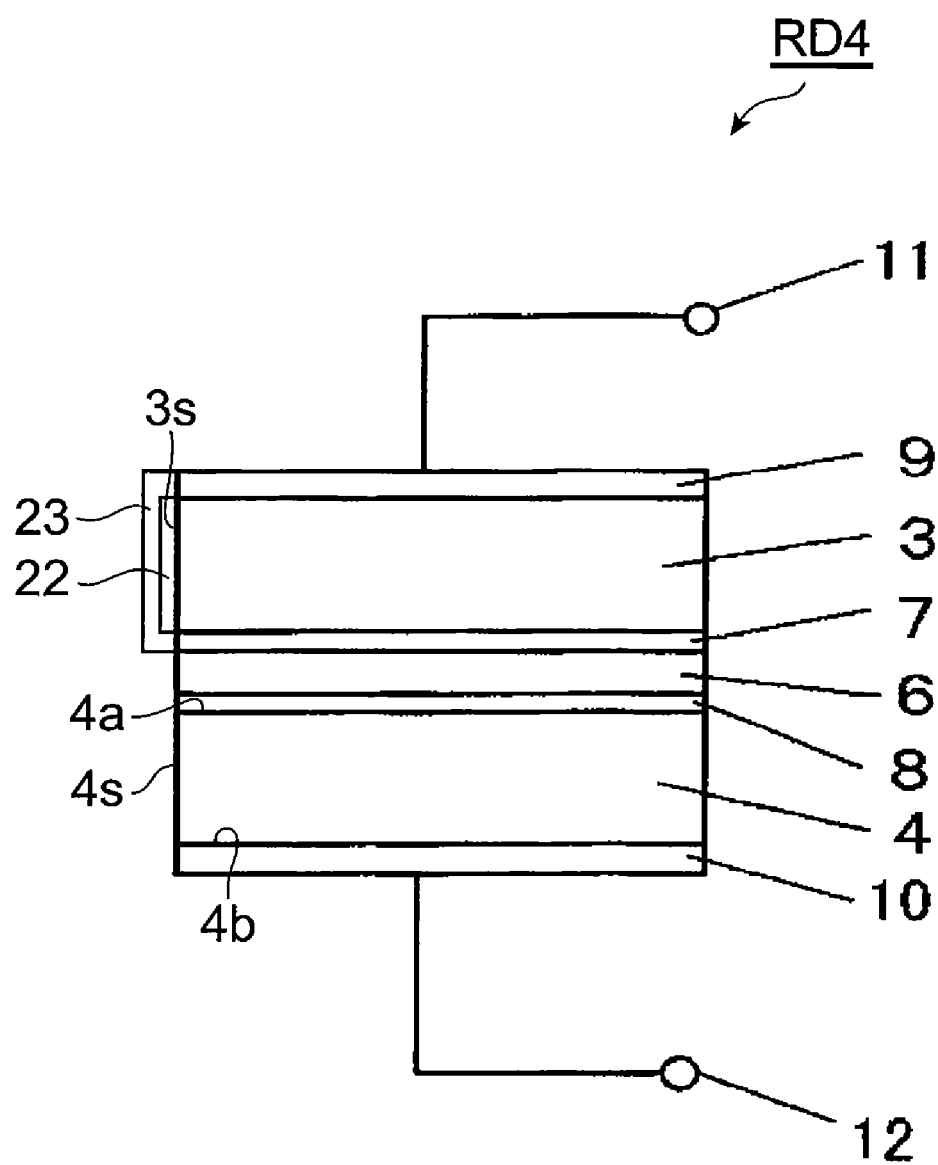
FIG. 7 is a drawing schematically showing a radiation detector according to a fourth embodiment.

FIG. 7 is a drawing schematically showing a radiation detector according to a fourth embodiment. In addition to the constitution of the radiation detector RD3, the radiation detector RD4 shown in FIG. 7 further comprises an insulating layer 22 provided between the conductor layer 23 and the side surface 3s on which the conductor layer 23 is provided. The insulating layer 22 covers the side surface 3s. The insulating layer 22 is formed on the side surface 3s using vapor deposition.

For the radiation detector RD4, working effects similar to for the radiation detector RD3 are obtained, and in addition leakage of current out from the conductor layer 23 is made not prone to occur due to the insulating layer 22. The bias voltage applied to the Si substrate 3 can thus be adjusted more precisely by adjusting the resistance of the conductor layer 23.

Fifth Embodiment

Figure 8:
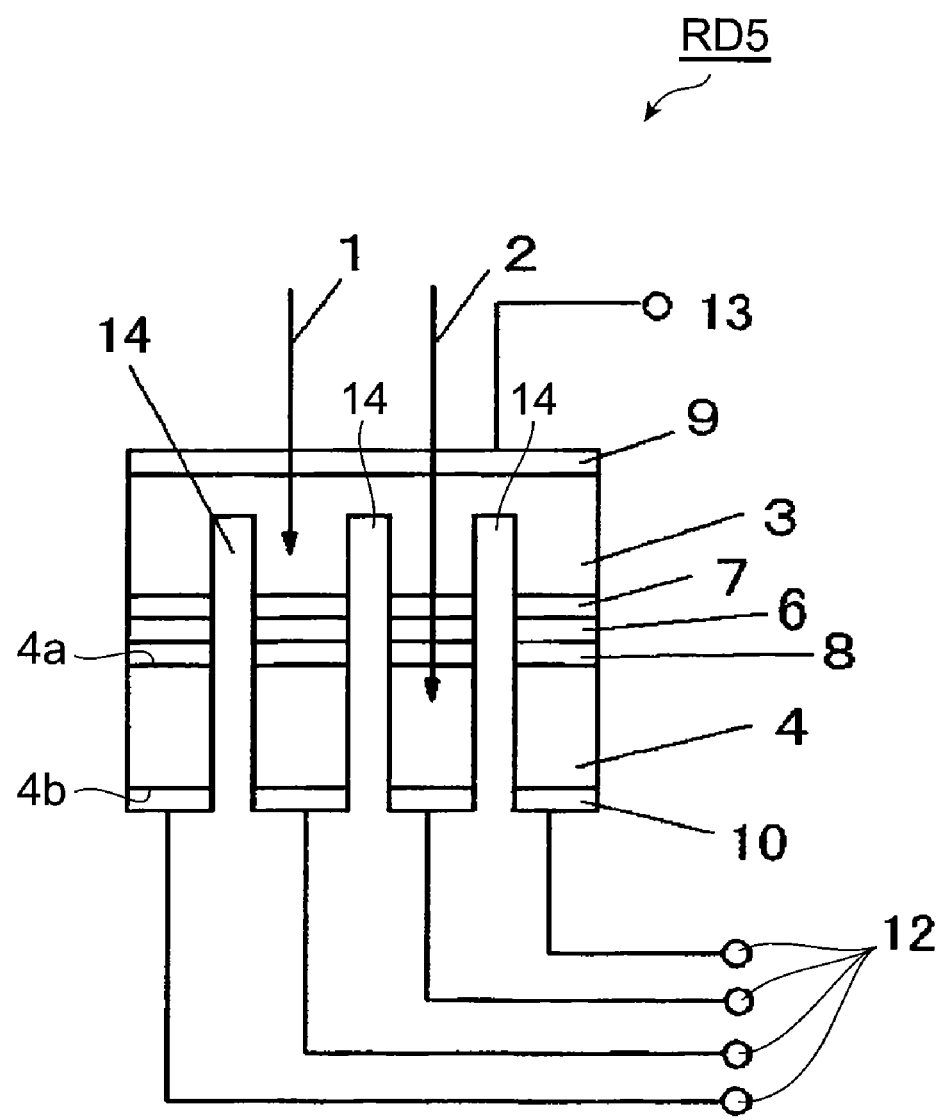
FIG. 8 is a drawing schematically showing a radiation detector according to a fifth embodiment.
Figure 9:
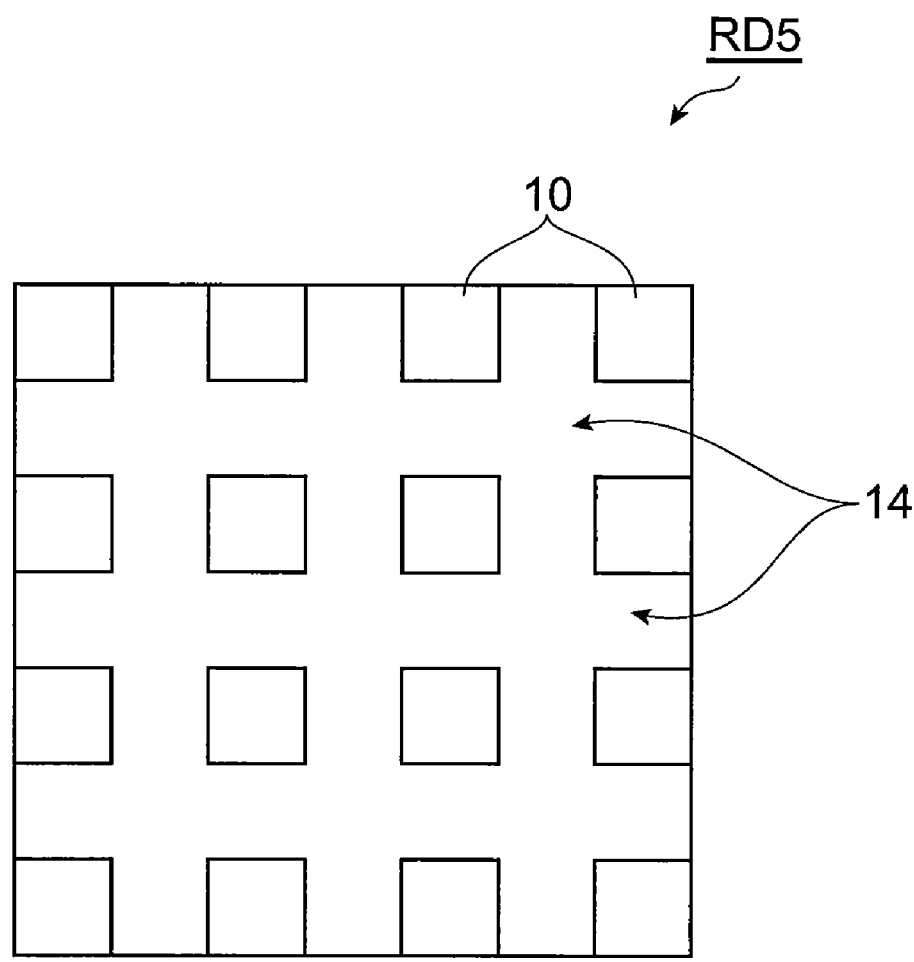
FIG. 9 is a plan view schematically showing the radiation detector according to the fifth embodiment.

FIG. 8 is a drawing schematically showing a radiation detector according to a fifth embodiment. FIG. 9 is a plan view schematically showing the radiation detector according to the fifth embodiment. In the radiation detector RD5 shown in FIGS. 8 and 9, separating strips 14 that reach from the rear surface 4b of the CdTe substrate 4 of the radiation detector RD2 to the Si substrate 3 are formed. In the present embodiment, the separating strips 14 are grooves in a lattice shape. Through the separating strips 14, the p-type CdTe layer 10, the CdTe substrate 4, the n-type CdTe layer 8, the In layer 6, and the p-type Si layer 7 are partitioned into a plurality of elements arranged two-dimensionally. Signal terminals 12 are electrically connected by wires respectively to the plurality of partitioned elements. On the other hand, one signal terminal 13 is electrically connected by a wire to the n-type Si layer 9.

For the radiation detector RD5, working effects similar to for the radiation detector RD2 are obtained. Moreover, because the individual elements are electrically separated from one another by the separating strips 14, the radiation detector RD5 can be used as a two-dimensional image sensor. In the radiation detector RD5, because only one signal terminal 13 is used, the wiring can be simplified.

The radiation detector RD5 is manufactured through carrying out a separating strip formation step as described below after the heating compression bonding step described earlier.

(Separating Strip Formation Step)

The separating strips 14 are formed in the CdTe substrate 4 using a mechanical method such as cutting using a dicing saw or a wire saw or a chemical method such as etching. In this way, the radiation detector RD5 shown in FIGS. 8 and 9 can be manufactured.

A CdTe crystal generally has low mechanical strength, and hence it is difficult to process a CdTe crystal into minute chips with the chips arranged two-dimensionally. On the other hand, with the radiation detector RD5, the Si substrate 3 acts as a support for the CdTe substrate 4, and hence the mechanical strength of the CdTe substrate 4 is high. The separating strips 14 can thus be formed easily, and hence separation into elements can easily be carried out.

The signal terminal 13 is formed by connecting a wire to the n-type Si layer 9. The signal terminals 12 are formed, for example, as follows. First, one or more wires are formed on a ceramic substrate, and bumps made of a metal or an electrically conductive adhesive are formed on the wire(s). The positions of the bumps correspond to the positions of the plurality of elements formed by partitioning the CdTe substrate 4. After that, the bumps are pressure-welded to the p-type CdTe layer 10 so as to form the signal terminals 12.

Sixth Embodiment

Figure 10:
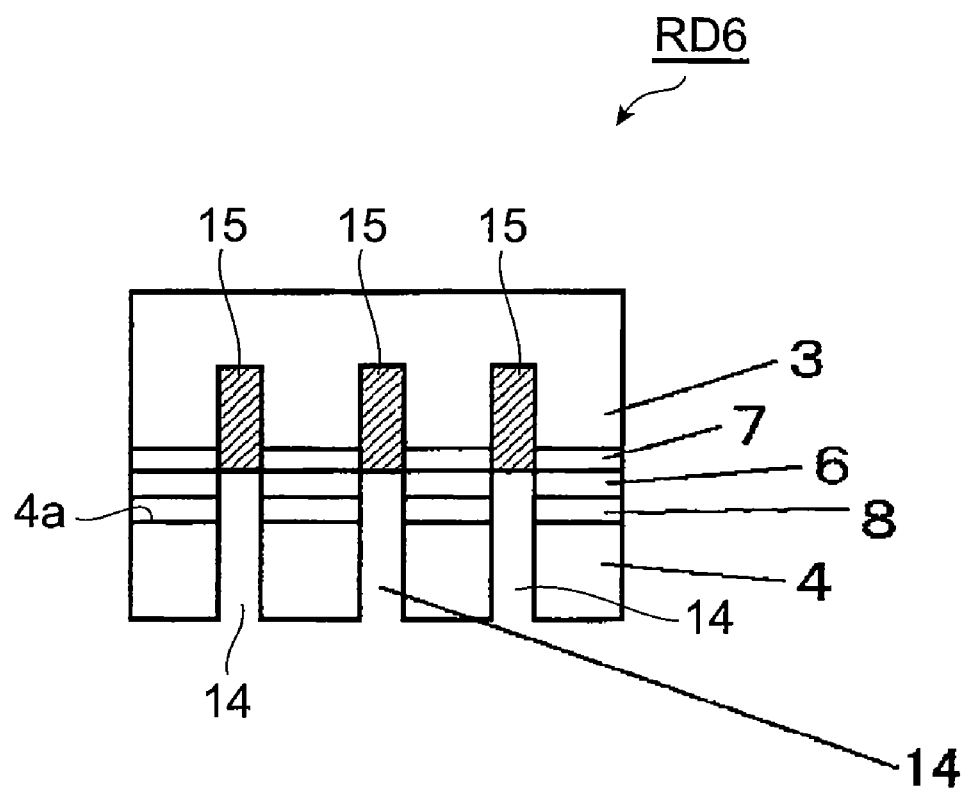
FIG. 10 is a drawing schematically showing a radiation detector according to a sixth embodiment.

FIG. 10 is a drawing schematically showing a radiation detector according to a sixth embodiment. In the radiation detector RD6 shown in FIG. 10, an insulator 15 is filled into the grooves constituting the separating strips 14 in the radiation detector RD5. The insulator 15 covers exposed surfaces of the Si substrate 3. The insulator 15 comprises, for example, $SiO_2$.

For the radiation detector RD6, working effects similar to for the radiation detector RD5 are obtained. Moreover, due to the insulator 15, increase of a dark current caused by the exposed surface of the Si substrate 3 can be suppressed.

Figure 11:
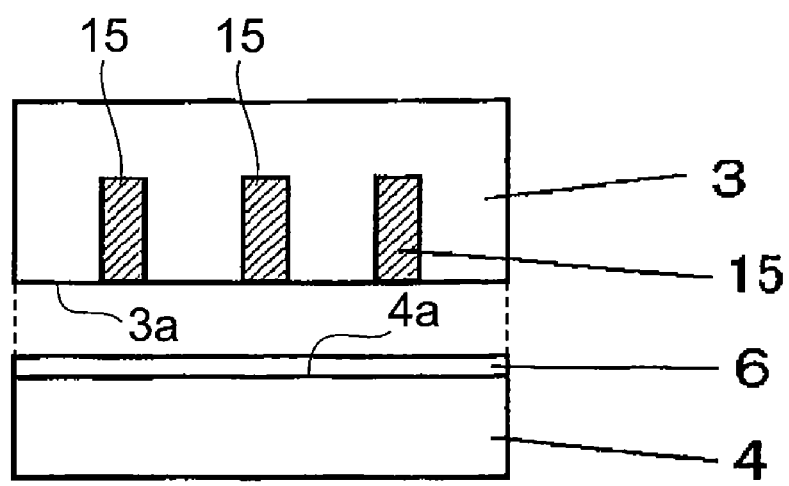
FIG. 11 is a process drawing schematically showing a method for manufacturing the radiation detector according to the sixth embodiment.

FIG. 11 is a process drawing schematically showing a method for manufacturing the radiation detector according to the sixth embodiment. The radiation detector RD6 is manufactured, for example, as follows. As shown in FIG. 11, grooves are formed in the main surface 3a of the Si substrate 3 through cutting or the like, and then the insulator 15 is filled into the grooves. An insulator 15 made of $SiO_2$ may alternatively be formed by oxidizing side walls of the grooves. On the other hand, a CdTe substrate 4 having an In layer 6 deposited thereon by vapor deposition is prepared.

Next, the Si substrate 3 and the CdTe substrate 4 are disposed facing one another with the In layer 6 therebetween, and the Si substrate 3 and the CdTe substrate 4 are compression-bonded together by heating. In this way, the radiation detector RD6 shown in FIG. 10 can be manufactured.

Seventh Embodiment

Figure 12:
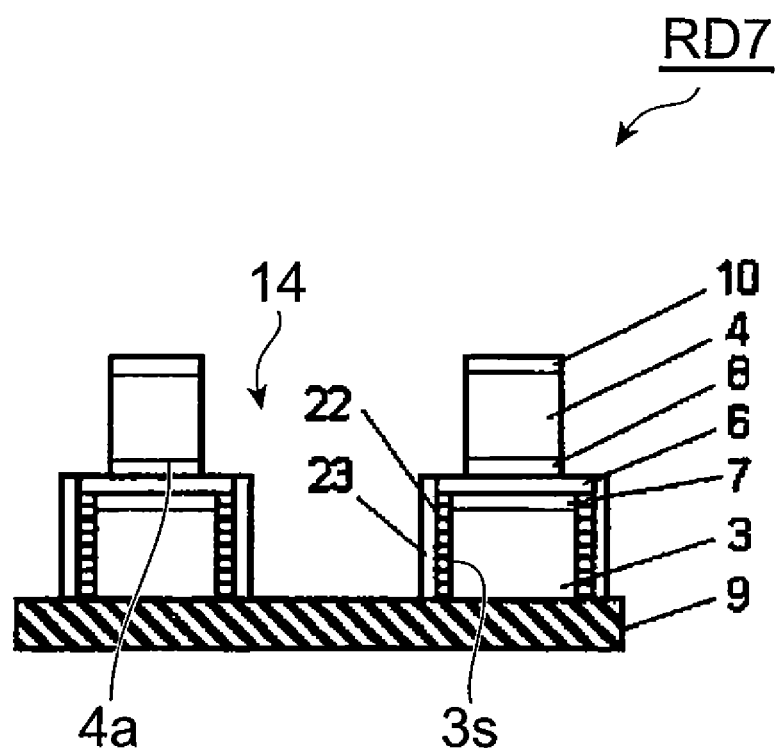
FIG. 12 is a drawing schematically showing a radiation detector according to a seventh embodiment.

FIG. 12 is a drawing schematically showing a radiation detector according to a seventh embodiment. In the radiation detector RD7 shown in FIG. 12, the separating strips 14 in the radiation detector RD5 also partition the Si substrate 3. Furthermore, the radiation detector RD7 has an insulating layer 22 and a conductor layer 23 provided in this order on each side surface 3s of the Si substrate 3. In FIG. 12, the signal terminals 12 and 13 are not shown. For the radiation detector RD7, the working effects of both the radiation detector RD4 and the radiation detector RD5 are obtained.

In the radiation detector RD7, a leakage current in the CdTe substrate 4 is actively utilized. This leakage current is a current that flows through the CdTe substrate 4 through movement of carriers thermally excited at ambient temperature when a reverse bias voltage is applied to the CdTe substrate 4. The leakage current is large in the case that the crystallinity of the CdTe is not good. Moreover, such a leakage current also arises due to a surface recombination level caused by processing damage formed on a side surface of the CdTe substrate 4 when the separating strips 14 are formed.

FIGS. 13A to 13D are process drawings schematically showing a method for manufacturing the radiation detector according to the seventh embodiment. Following is a description of a method for manufacturing the radiation detector RD7.

(Heating Compression Bonding Step)

Figure 13A:
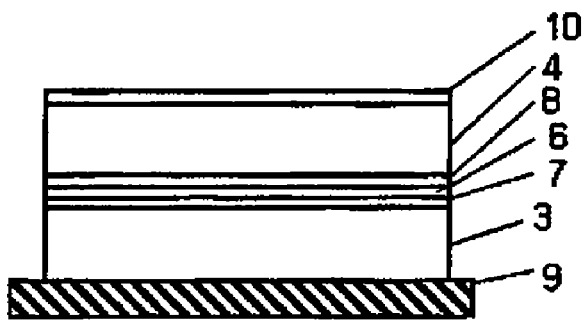
FIGS. 13A to 13D are process drawings schematically showing a method for manufacturing the radiation detector according to the seventh embodiment.

After the metal layer formation step described earlier, the Si substrate 3 and the CdTe substrate 4 are disposed facing one another with the In layer 6 therebetween, and the Si substrate 3 and the CdTe substrate 4 are compression-bonded together by heating, thus forming a laminate as shown in FIG. 13A.

(Separating Strip Formation Step)

Figure 13B:
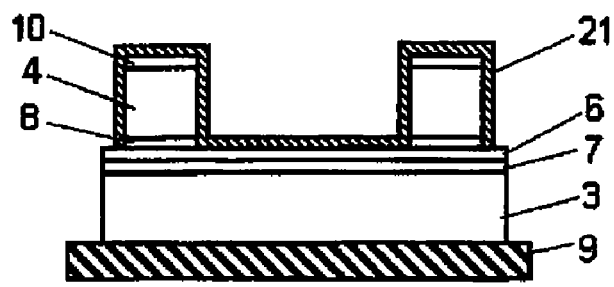

As shown in FIG. 13B, the p-type CdTe layer 10, the CdTe substrate 4, and the n-type CdTe layer 8 are subjected to etching or dicing. As a result, separation of the CdTe substrate 4 into elements is carried out. After that, side surfaces and upper surfaces of the partitioned CdTe substrate 4 are covered with a protective material 21 such as a resist.

Figure 13C:
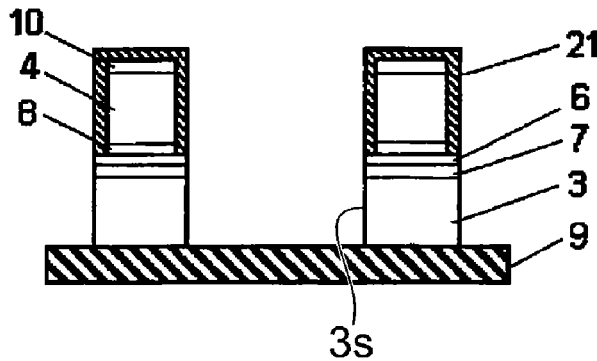
Figure 13D:
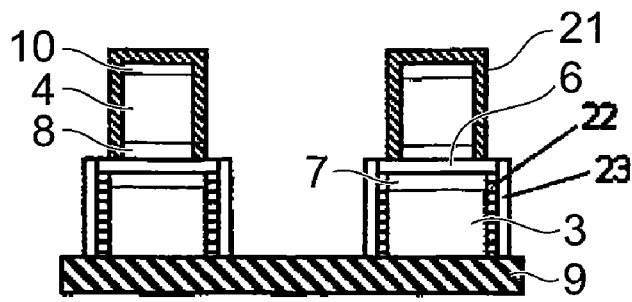

As shown in FIG. 13C, the In layer 6, the p-type Si layer 7, and the Si substrate 3 are subjected to etching or dicing. As a result, separation of the Si substrate 3 into elements is carried out. After that, an insulating layer 22 of silicon oxide or the like is deposited by vapor deposition onto side surfaces 3s of the partitioned Si substrate 3. Furthermore, a conductor layer 23 such as a thin metal film is deposited by vapor deposition so as to cover the insulating layer 22, thus forming a resistor. The conductor layer 23 is electrically connected to the In layer 6 and the n-type Si layer 9. Next, the protective material 21 is removed. In this way, the radiation detector RD7 shown in FIG. 12 can be manufactured.

According to the radiation detectors RD1 to RD7 of the first to seventh embodiments, electromagnetic radiation over a broad energy range from soft X-rays to hard X-rays and γ-rays can be detected. Moreover, the CdTe substrate 4, which has low mechanical strength, can be partitioned easily, and hence an image sensing element for obtaining a two-dimensional image can be manufactured at low cost.

Preferred embodiments of the present invention have been described in detail above. However, the present invention is not limited to the above embodiments.

For example, instead of the In layer 6, a metal layer containing a group V element may be used. In this case, the p-type Si layer 7 becomes an n-type Si layer, and the n-type CdTe layer 8 becomes a p-type CdTe layer.

Moreover, instead of the Si substrate 3, for example a group III-V compound semiconductor substrate such as a GaAs substrate having a surface thereof subjected to doping treatment can be used.

What is claimed is:

1. A radiation detector, comprising:
a CdTe or CdZnTe compound semiconductor substrate that absorbs X-radiation having a first energy and has a main surface and a rear surface opposite to each other through the CdTe or CdZnTe compound semiconductor substrate;
a CdTe or CdZnTe compound semiconductor layer of a first conductivity type having first and second surfaces opposite to each other through the CdTe or CdZnTe compound semiconductor layer, and the first surface of the CdTe or CdZnTe compound semiconductor layer being attached to the main surface of the CdTe or CdZnTe compound semiconductor substrate;
a metal layer consisting essentially of metallic In and having first and second surfaces opposite to each other through the metal layer, wherein the first and second surfaces of the metal layer do not meet each other, the first surface of the metal layer being attached to the second surface of the CdTe or CdZnTe compound semiconductor layer;
a Si semiconductor layer of a second conductivity type opposite to the first conductivity type, having first and second surfaces opposite to each other through the Si semiconductor layer, and the first surface of the Si semiconductor layer being attached to the second surface of the metal layer; and
a Si semiconductor substrate that absorbs X-radiation having a second energy different from the first energy and has first and second surfaces opposite to each other through the Si semiconductor substrate, the first surface of the Si semiconductor substrate being attached to the second surface of the Si semiconductor layer.

2. The radiation detector according to claim 1, further comprising a conductor layer provided on a surface of at least one of: the CdTe or CdZnTe compound semiconductor substrate, and the Si semiconductor substrate.

3. The radiation detector according to claim 2, further comprising an insulating layer provided between the surface having the conductor layer provided thereon and the conductor layer.

4. The radiation detector according to claim 1, wherein separating strips reaching to the Si semiconductor substrate from the rear surface of the CdTe or CdZnTe compound semiconductor substrate are formed.

5. The radiation detector according to claim 4, wherein the separating strips are formed in a lattice shape.

6. The radiation detector according to claim 4, wherein the separating strips are grooves.

7. The radiation detector according to claim 6, wherein an insulator is filled into the grooves.

8. The radiation detector according to claim 1, further comprising two conductive layers, one of the conductive layers being provided on the rear surface of the CdTe or CdZnTe compound semiconductor substrate, and the other conductive layer being provided on the second surface of the Si semiconductor substrate.

9. The radiation detector according to claim 1, wherein the radiation detector is configured such that it passes X-radiation, received at the second surface of the Si semiconductor substrate from an outside of the radiation detector, to reach the CdTe or CdZnTe compound semiconductor substrate through the metal layer.

10. The radiation detector according to claim 1, wherein the X-radiation having the first energy absorbed by the CdTe or CdZnTe compound semiconductor substrate is hard X-rays, and the X-radiation having the second energy absorbed by the Si semiconductor substrate is soft X-rays.

11. The radiation detector according to claim 1, wherein the Si semiconductor layer and the CdTe or CdZnTe compound semiconductor layer include In as a dopant.

12. The radiation detector according to claim 1, wherein the metal layer has a predetermined thickness which prevents drift of electrons and holes between the Si semiconductor layer and the CdTe compound semiconductor layer.

13. The radiation detector according to claim 1, wherein the metal layer is continuous.

14. The radiation detector according to claim 13, wherein the metal layer extends continuously and is coextensive with the CdTe or CdZnTe compound semiconductor layer and the Si semiconductor layer.

15. A radiation detector, comprising:
a CdTe or CdZnTe compound semiconductor substrate that absorbs X-radiation having a first energy and has a main surface and a rear surface opposite to each other through the CdTe or CdZnTe compound semiconductor substrate;
a CdTe or CdZnTe compound semiconductor layer of a first conductivity type having first and second surfaces opposite to each other through the CdTe or CdZnTe compound semiconductor layer, and the first surface of the CdTe or CdZnTe compound semiconductor layer being attached to the main surface of the CdTe or CdZnTe compound semiconductor substrate;

a metal layer consisting essentially of metallic In and having first and second surfaces opposite to each other through the metal layer, and the first surface of the metal layer being attached to the second surface of the CdTe or CdZnTe compound semiconductor layer;

a Si semiconductor layer of a second conductivity type opposite to the first conductivity type, having first and second surfaces opposite to each other through the Si semiconductor layer, and the first surface of the Si semiconductor layer being attached to the second surface of the metal layer; and a Si semiconductor substrate that absorbs X-radiation having a second energy different from the first energy and has first and second surfaces opposite to each other through the Si semiconductor substrate, the first surface of the Si semiconductor substrate being attached to the second surface of the Si semiconductor layer;

wherein the metal layer extends continuously and is coextensive with the CdTe or CdZnTe compound semiconductor layer and the Si semiconductor layer.

* * * * *